(12) United States Patent
Liu et al.

(10) Patent No.: US 10,826,468 B1
(45) Date of Patent: Nov. 3, 2020

(54) ACTIVE DAMPING CIRCUIT OF DEAD TIME OSCILLATION

(71) Applicant: ASIAN POWER DEVICES INC., Taoyuan (TW)

(72) Inventors: Ganghong Liu, Taoyuan (TW); Wei Tang, Taoyuan (TW)

(73) Assignee: Asian Power Devices Inc., Taoyuan (TW)

( * ) Notice: Subject to any disclaimer, the term of this patent is extended or adjusted under 35 U.S.C. 154(b) by 0 days.

(21) Appl. No.: 16/718,846

(22) Filed: Dec. 18, 2019

(30) Foreign Application Priority Data

Nov. 15, 2019 (TW) .............................. 108215181 A

(51) Int. Cl.
*H02M 1/15* (2006.01)
*H02M 1/34* (2007.01)
*H02M 3/00* (2006.01)
*H02M 3/335* (2006.01)
*H03K 3/30* (2006.01)
*H02J 3/24* (2006.01)

(52) U.S. Cl.
CPC ................. *H03K 3/30* (2013.01); *H02J 3/24* (2013.01); *H02M 3/33507* (2013.01); *H02M 3/33592* (2013.01)

(58) Field of Classification Search
None
See application file for complete search history.

(56) References Cited

U.S. PATENT DOCUMENTS

| 4,987,366 | A  | * | 1/1991  | Hamel ............... | H03K 17/9502 |
|-----------|----|---|---------|----------------------|--------------|
|           |    |   |         |                      | 324/207.26   |
| 7,123,462 | B2 | * | 10/2006 | Uekawa ............... | H02M 5/257   |
|           |    |   |         |                      | 361/100      |
| 9,780,642 | B2 | * | 10/2017 | Skinner ................. | H02M 1/34 |
| 10,224,819 | B2 | * | 3/2019  | Shamsi ................. | H02M 7/483 |
| 10,243,450 | B2 | * | 3/2019  | Bastholm ............... | H02M 1/34 |
| 10,418,906 | B2 | * | 9/2019  | Yang .................. | H02M 3/33507 |
| 10,536,035 | B2 | * | 1/2020  | Joye ........................ | H02J 50/12 |

* cited by examiner

*Primary Examiner* — Kenneth B Wells

(74) *Attorney, Agent, or Firm* — Muncy, Geissler, Olds & Lowe, P.C.

(57) ABSTRACT

An active damping circuit of dead time oscillation includes a damping unit, a main switch, a voltage biased unit, an auxiliary switch, and a voltage determining unit. The main switch is coupled to the damping unit. The voltage biased unit is coupled to the damping unit and the main switch, and the voltage biased unit provides a drive voltage to the main switch. The auxiliary switch is coupled to the voltage biased unit. The voltage determining unit is coupled to the auxiliary switch, the voltage biased unit, and the damping unit, and the voltage determining unit provides a threshold voltage. When a voltage across two ends of a winding of a transformer is less than the threshold voltage, the auxiliary switch is turned off so that the drive voltage turns on the main switch and enable the damping unit to suppress the dead time oscillation.

9 Claims, 5 Drawing Sheets

ACTIVE DAMPING CIRCUIT OF DEAD TIME OSCILLATION

BACKGROUND

Technical Field

The present disclosure relates to a damping circuit, and more particularly to an active damping circuit of dead time oscillation.

Description of Related Art

The statements in this section merely provide background information related to the present disclosure and do not necessarily constitute prior art.

The statements in this section merely provide background information related to the present disclosure and do not necessarily constitute prior art.

Please refer to FIG. 1 and FIG. 2, FIG. 1 is a circuit diagram of a flyback power converter in the related art, and FIG. 2 is a schematic waveform of a winding voltage of a transformer of the flyback power converter in FIG. 1. Specifically, the waveform of the winding voltage is shown when the flyback power converter operates under a discontinuous current mode (DCM). In the switching power supply, when a power switch Q1 and a diode DE1 at a secondary side are both turned off, a transformer T1 or inductor(s) and parallel-connected or series-connected capacitor(s) are in free oscillation. Since the free oscillation occurs when the power switch Q1 and the diode DE1 are both turned off, the free oscillation is also referred to as a dead-time oscillation. Take the structure of the flyback switching power supply shown in FIG. 1 as an example.

When the power switch Q1 at a primary side is turned on, a primary-side inductor Lp is excited by an input voltage Vin during a period of Pri. $T_{ON}$ shown in FIG. 2. Therefore, a primary-side current Ip is linearly increased to store energy to the transformer T1, and the diode DE1 at the secondary side is turned off due to a reverse biased condition.

When the power switch Q1 at the primary side is turned off, a period Pri. $T_{OFF}$ shown in FIG. 2 may be divided into a 2nd $T_{ON}$ period and a DT (dead time) period. During the period of 2nd $T_{ON}$, the diode DE1 at the secondary side is turned on due to a forward biased condition, and the energy stored in the transformer T1 is transmitted to an output side through the diode DE1 at the secondary side, and therefore a secondary-side current Is is linearly reduced. When the secondary-side current Is is equal to zero, the transformer T1 is fully demagnetized. At this condition, the diode DE1 at the secondary side is turned off and the power switch Q1 at the primary side is also turned off to enter the period of DT (dead time). During the period of DT (dead time), the primary-side inductor Lp and surrounding capacitors having an equivalent capacitance Ctot are in LC free oscillation, i.e., the dead time oscillation, and an oscillation frequency ($f_{DT}$):

$$f_{DT} = \frac{1}{2\pi\sqrt{L_p C_{tot}}}.$$

In practical applications, the oscillation frequency is generally several hundred kHz, and if in the absence of effective suppression of this oscillation, it often causes the problem of noise interference.

Please refer to FIG. 3, which shows a circuit diagram of a passive damping circuit in the related art. In order to suppress the dead time oscillation, the RC passive snubber circuit shown in FIG. 3 is conventionally known and commonly used. However, the effect of RC damping contradicts the loss consumption it causes, that is, if the effect of damping is to be improved, the loss is increased since the RC passive snubber circuit is always connected.

SUMMARY

An object of the present disclosure is to provide an active damping circuit of dead time oscillation to solve problems of poor suppression of the dead time oscillation and increased losses.

In order to achieve the above-mentioned object, the active damping circuit of dead time oscillation is coupled to two ends of a winding of a transformer. The active damping circuit of dead time oscillation includes a damping unit, a main switch, a voltage biased unit, an auxiliary switch, and a voltage determining unit. The main switch is coupled to the damping unit. The voltage biased unit is coupled to the damping unit and the main switch, and the voltage biased unit provides a drive voltage to the main switch. The auxiliary switch is coupled to the voltage biased unit. The voltage determining unit is coupled to the auxiliary switch, the voltage biased unit, and the damping unit, and the voltage determining unit provides a threshold voltage. When a voltage across two ends of the winding of the transformer is less than the threshold voltage, the auxiliary switch is turned off so that the drive voltage is high-level to turn on the main switch and enable the damping unit to suppress the dead time oscillation.

In one embodiment, when the voltage across two ends of the winding of the transformer is greater than the threshold voltage, the auxiliary switch is turned on so that the drive voltage is low-level to turn off the main switch and disable the damping unit.

In one embodiment, the voltage determining unit is a Zener diode, and the threshold voltage is a breakdown voltage of the Zener diode.

In one embodiment, the auxiliary switch is a BJT.

In one embodiment, the voltage biased unit is a voltage-dividing resistor network.

In one embodiment, the main switch is a MOSFET.

In one embodiment, the damping unit is a resistor-capacitor network.

In one embodiment, the active damping circuit of dead time oscillation further includes a diode. The diode is coupled between the winding of the transformer and the damping unit.

In one embodiment, the active damping circuit of dead time oscillation is applied to a flyback converter, a forward converter, a push-pull converter, a half-bridge converter, or a full-bridge converter.

Accordingly, the active damping circuit of dead time oscillation is used to actively introduce the damping circuit when the dead time oscillation definitely occurs, thereby significantly reducing the energy consumption caused by the damping circuit and increasing efficiency.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
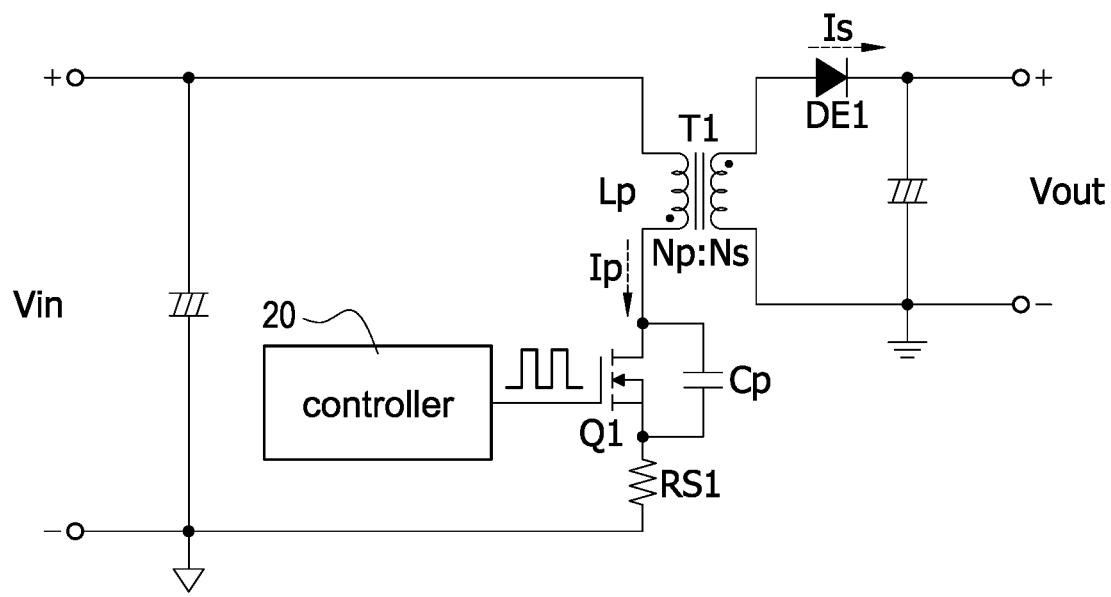
FIG. 1 is a circuit diagram of a flyback power converter in the related art.

Reference will now be made to the drawing figures to describe the present disclosure in detail. It will be understood that the drawing figures and exemplified embodiments of present disclosure are not limited to the details thereof.

Figure 4:
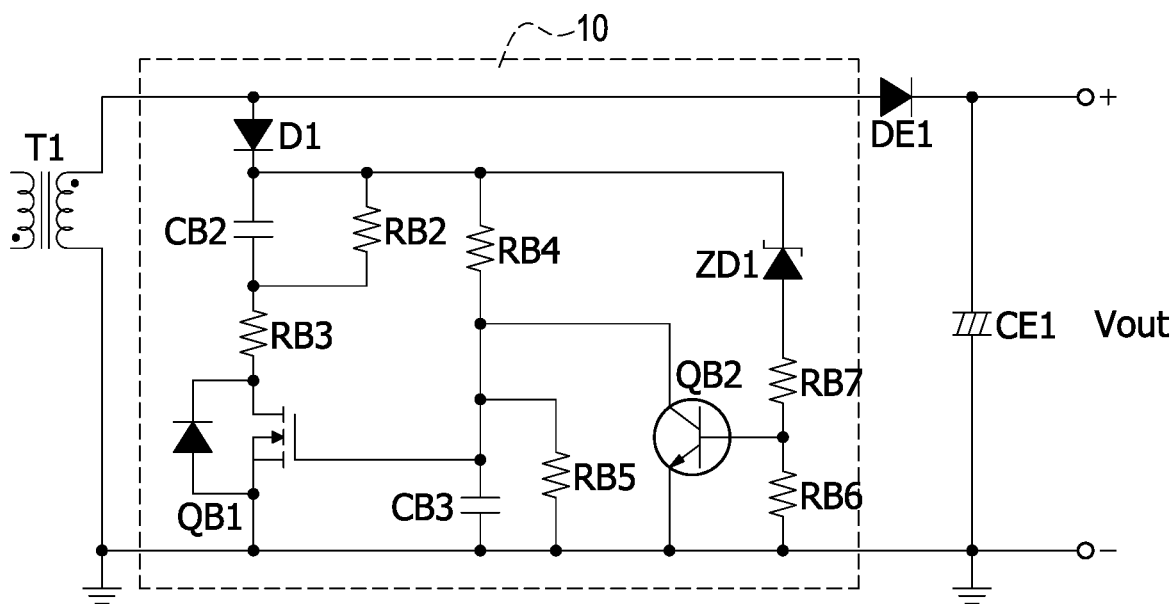
FIG. 4 is a circuit diagram of an active damping circuit of dead time oscillation according to the present disclosure.

Please refer to FIG. 4, which shows a circuit diagram of an active damping circuit of dead time oscillation according to the present disclosure. The active damping circuit of dead time oscillation 10 is coupled to two ends of a winding of a transformer T1. In this embodiment, the active damping circuit of dead time oscillation 10 is coupled to two ends of a secondary-side winding of the transformer T1. The active damping circuit of dead time oscillation 10 includes a damping unit, a main switch QB1, a voltage biased unit, an auxiliary switch QB2, and a voltage determining unit ZD1.

The damping unit is a resistor-capacitor network. In this embodiment, the resistor-capacitor network includes two resistors RB2, RB3 and a capacitor CB2. The capacitor CB2 is used to store the energy generated when the dead time oscillation occurs. The resistor RB3 is used to provide damping to achieve the oscillation damping. The resistor RB2 is used to provide a release path of the oscillation energy stored in the capacitor CB2 so as to prevent the energy stored in the previous cycle from continuously accumulating to the next cycle, and therefore the capacitor CB2 cannot achieve the function of energy storage.

The main switch QB1 is coupled to the damping unit. In this embodiment, the main switch QB1 is a voltage-controlled transistor switch, such as a MOSFET. A drain of the main switch QB1 is coupled to the resistor RB3 of the damping unit, and a source of the main switch QB1 is coupled to a ground end on the secondary side of the transformer T1.

The voltage biased unit is coupled to the damping unit and the main switch QB1 to provide a drive voltage to the main switch QB1. The voltage biased unit is a voltage-dividing resistor network. In this embodiment, the voltage-dividing resistor network includes two resistors RB4,RB5, and the voltage-dividing resistor network is used to divide a voltage at the secondary side of the transformer T1 to provide the required drive voltage for the main switch QB1. In addition, the voltage biased unit further includes a capacitor CB3, and the capacitor CB3 can work with the two resistors RB4,RB5 to achieve an effect of delay adjustment. The drive voltage is provided to a gate of the main switch QB1 to control turning on or turning off the main switch QB1. If the drive voltage is a high-level voltage, the main switch QB1 is turned on, and if the drive voltage is a low-level voltage, the main switch QB1 is turned off, and the detailed description will be made hereinafter.

The auxiliary switch QB2 is coupled to the voltage biased unit. In this embodiment, the auxiliary switch QB2 is a current-controlled transistor switch, such as a BJT. A collector of the auxiliary switch QB2 is coupled between the resistors RB4,RB5 of the voltage biased unit, and an emitter of the auxiliary switch QB2 is coupled to the ground end on the secondary side of the transformer T1. Furthermore, two resistors RB6, RB7 are used to provide base bias and determine DC operating points of the auxiliary switch QB2.

Furthermore, the auxiliary switch QB2 transmits a base bias through the two resistors RB6, RB7 to determine the DC operating points of the auxiliary switch QB2.

The voltage determining unit ZD1 is coupled to the auxiliary switch QB2, the voltage biased unit, and the damping unit to provide a threshold voltage. In this embodiment, the voltage determining unit ZD1 is a Zener diode, and the threshold voltage is a breakdown voltage of the Zener diode.

The active damping circuit of dead time oscillation 10 further includes a diode D1. The diode D1 is coupled between the secondary-side winding of the transformer T1 and the damping unit to provide a forward-biased turned-on path of the active damping circuit of dead time oscillation 10.

Figure 5:
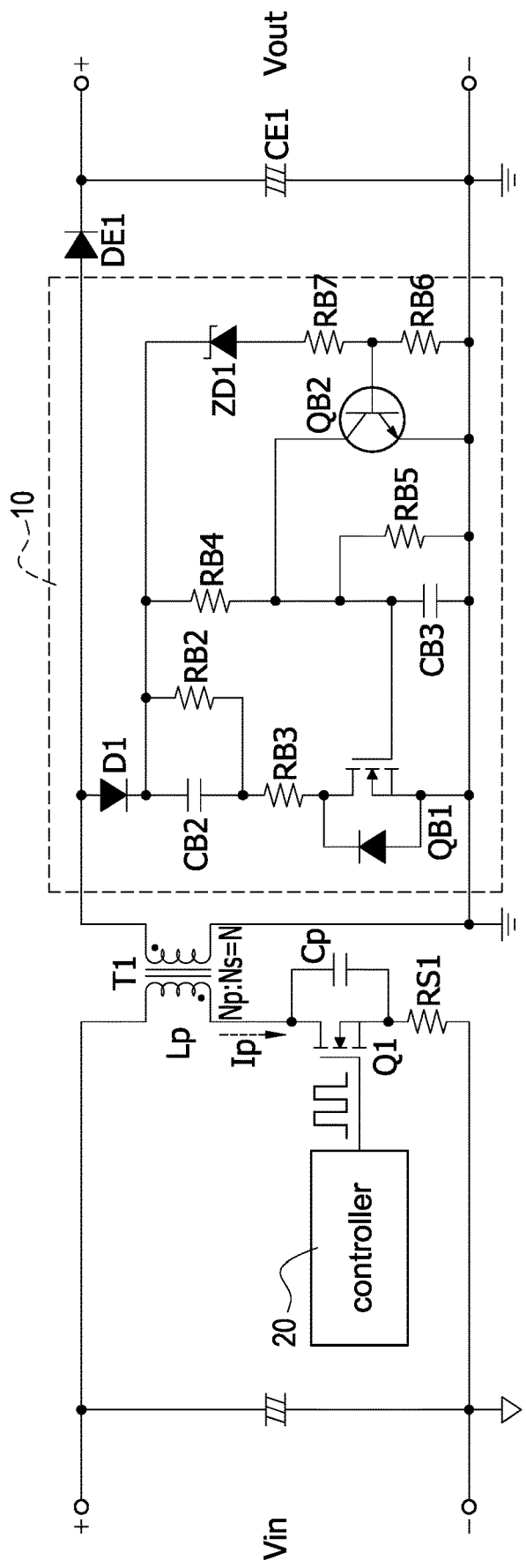
FIG. 5 is a circuit diagram of the active damping circuit of dead time oscillation applied to a flyback power converter according to the present disclosure.

Please refer to FIG. 5, which shows a circuit diagram of the active damping circuit of dead time oscillation applied to a flyback power converter according to the present disclosure. In this present disclosure, the active damping circuit of dead time oscillation 10 is not limited to be applied to a specific topology circuit. As long as the circuit topology of the dead time oscillation condition is generated, the active damping circuit can be used to suppress and improve the dead time oscillation. For example, the active damping circuit of dead time oscillation 10 may be applied to a flyback converter, a forward converter, a push-pull converter, a half-bridge converter, or a full-bridge converter, however, this is not a limitation of the present disclosure. In order to facilitate the explanation of the operation principle of the active damping circuit of the present disclosure, take the flyback power converter as an example.

Figure 6:
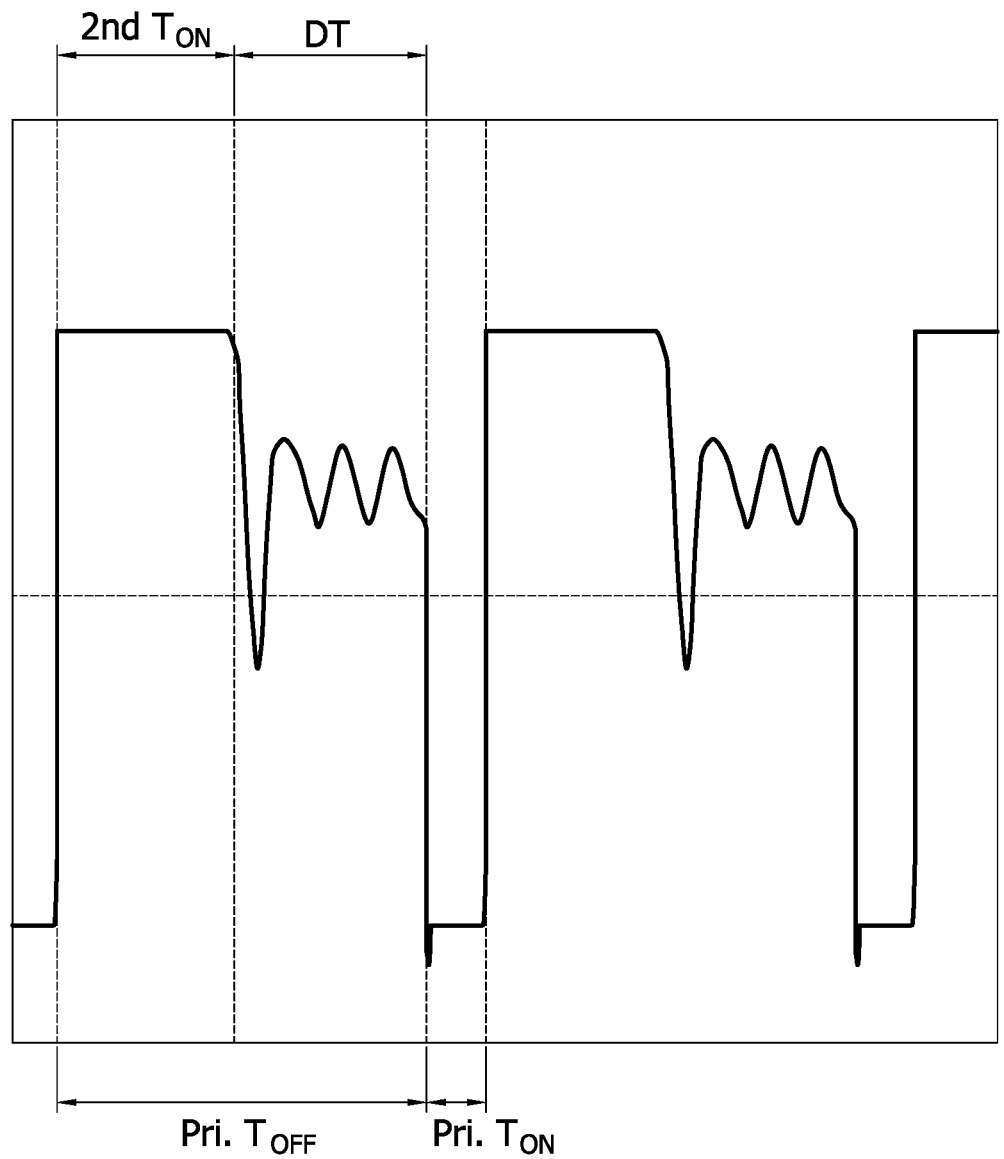
FIG. 6 is a schematic waveform of a winding voltage of a transformer of the active damping circuit of dead time oscillation applied to the flyback power converter according to the present disclosure.

Please refer to FIG. 6, which shows a schematic waveform of a winding voltage of a transformer of the active damping circuit of dead time oscillation applied to the flyback power converter according to the present disclosure. As mentioned above, when the power switch Q1 at the primary side is turned on, the primary-side inductor Lp is excited by the input voltage Vin during a period of Pri. $T_{ON}$ shown in FIG. 6. Therefore, a primary-side current Ip is linearly increased to store energy to the transformer T1, and the diode DE1 at the secondary side is turned off due to a reverse biased condition.

When the power switch Q1 at the primary side is turned off, a period Pri. $T_{OFF}$ shown in FIG. 6 may be divided into a 2nd $T_{ON}$ period and a DT (dead time) period. During the period of 2nd $T_{ON}$, the diode DE1 at the secondary side is turned on due to a forward biased condition, and the energy stored in the transformer T1 is transmitted to an output side through the diode DE1 at the secondary side, and therefore a secondary-side current Is linearly reduced. When the secondary-side current Is is equal to zero, the transformer T1 is fully demagnetized. At this condition, the diode DE1 at the secondary side is turned off and the power switch Q1 at the primary side is also turned off to enter the period of DT (dead time). In particular, before entering the period of DT (dead time), i.e., during the period of 2nd $T_{ON}$, if a voltage across a secondary-side winding of the transformer T1 is greater than the threshold voltage (i.e., greater than the breakdown voltage of the Zener diode) of the voltage determining unit, the Zener diode works in the breakdown zone. At this condition, a sufficiently large (reverse bias) current flows through the Zener diode to turn on the auxiliary switch QB2. When the auxiliary switch QB2 is turned on, a potential between the two resistors RB4,RB5 is equal to a ground potential. The zero potential makes the drive voltage of the main switch QB1 provided by the voltage biased unit to be low-level, and therefore the main switch QB1 is turned off to disable the damping unit. That is, the damping unit is disconnected at two ends of the secondary-side winding of the transformer T1, i.e., the damping unit is equivalently removed.

Figure 2:
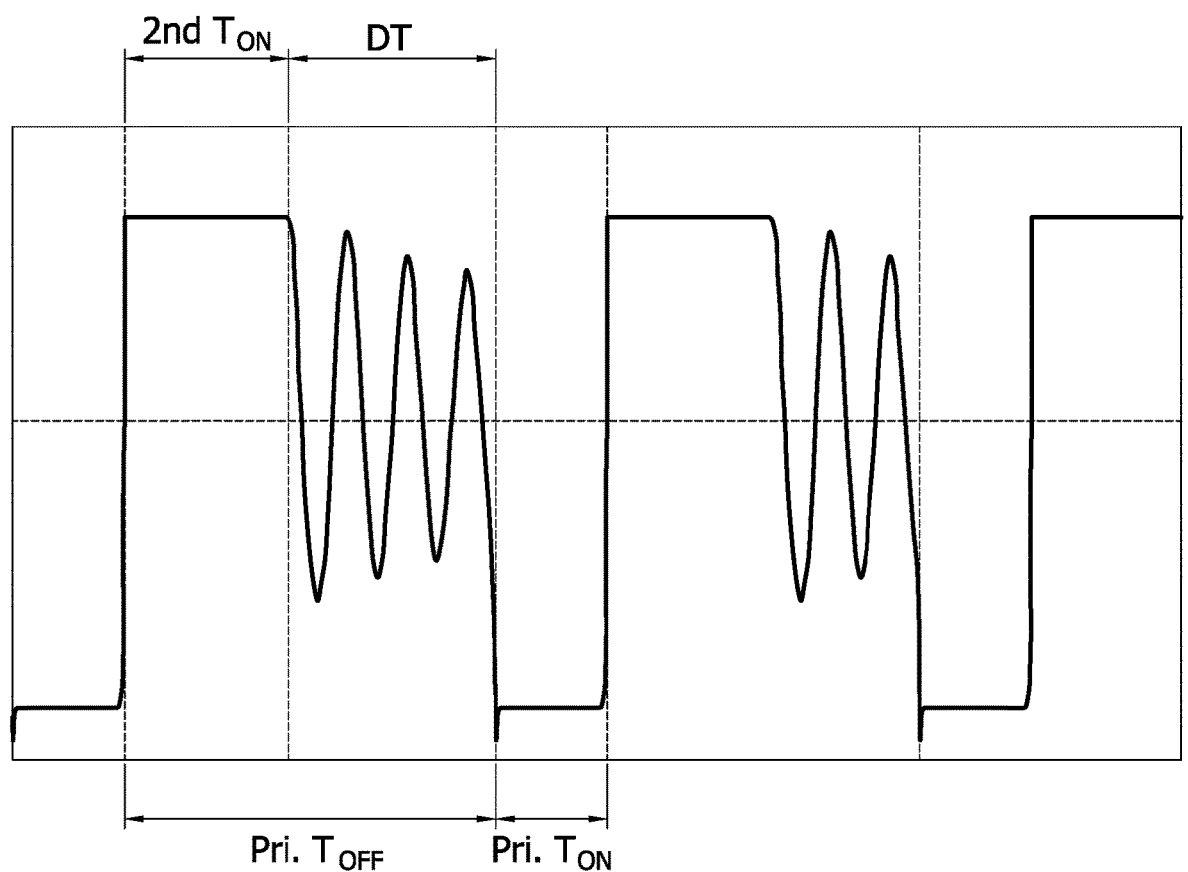
FIG. 2 is a schematic waveform of a winding voltage of a transformer of the flyback power converter in FIG. 1.
Figure 3:
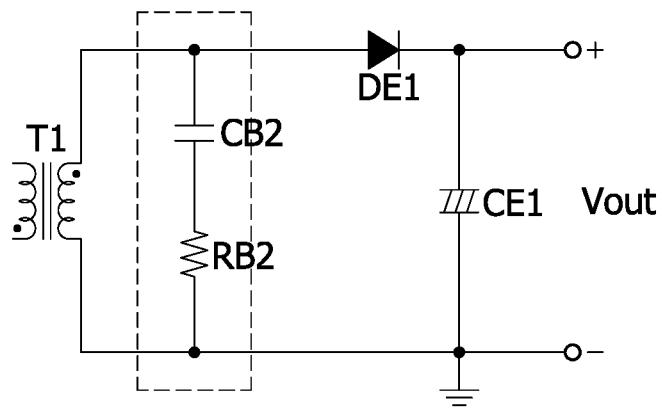
FIG. 3 is a circuit diagram of a passive damping circuit in the related art.

On the contrary, when entering the period of DT (dead time), since the voltage across the secondary-side winding of the transformer T1 is less than the threshold voltage (i.e., less than the breakdown voltage of the Zener diode) of the voltage determining unit, the Zener diode is reverse-biased but not breakdown. At this condition, the reverse bias current is quite small. The small reverse bias current flows through the Zener diode but fails to turn on the auxiliary switch QB2. When the auxiliary switch QB2 is turned off, the two resistors RB4,RB5 are provided to divide the voltage at the secondary side of the transformer T1 so that the divided voltage is sufficient to drive the main switch QB1 turning on. At this condition, the drive voltage of the main switch QB1 provided by the voltage biased unit is to be high-level, and therefore the main switch QB1 is turned on to enable the damping unit. That is, the damping unit is connected at two ends of the secondary-side winding of the transformer T1, thereby suppressing the dead time oscillation. Therefore, the parameters of the capacitor CB2 and the resistors RB2, RB3 of the damping unit can be appropriately designed to achieve the rapid attenuation of the dead time oscillation. It can be clearly seen from the comparison between FIG. 6 and FIG. 2 that the suppression effect of the dead time oscillation provided by the active damping circuit of the present disclosure is far superior to the suppression effect of the dead time oscillation provided by the passive damping circuit.

In conclusion, the present disclosure has following features and advantages:

1. By using a simple component of the Zener diode for determining the voltage across the secondary-side winding of the transformer T1, thereby enabling or disabling (removing) the damping unit.

2. By detecting time point of occurring the dead time oscillation to actively introduce the damping unit when the dead time oscillation definitely occurs, thereby significantly reducing the energy consumption caused by the damping circuit and increasing efficiency.

3. The parameters of the capacitor CB2 and the resistors RB2, RB3 of the damping unit can be appropriately designed to achieve the rapid attenuation of the dead time oscillation.

4. The active damping circuit of dead time oscillation of the present disclosure can be applied to various circuit topologies that require dead time oscillation suppression to increase the popularity of its application.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. An active damping circuit of dead time oscillation coupled to two ends of a winding of a transformer, the active damping circuit of dead time oscillation comprising:
   a damping unit,
   a main switch coupled to the damping unit,
   a voltage biased unit coupled to the damping unit and the main switch, and the voltage biased unit configured to provide a drive voltage to the main switch,
   an auxiliary switch coupled to the voltage biased unit, and
   a voltage determining unit coupled to the auxiliary switch, the voltage biased unit, and the damping unit, and the voltage determining unit configured to provide a threshold voltage,
   wherein when a voltage across two ends of the winding of the transformer is less than the threshold voltage, the auxiliary switch is turned off so that the drive voltage is high-level to turn on the main switch and enable the damping unit to suppress the dead time oscillation.

2. The active damping circuit of dead time oscillation in claim 1, wherein when the voltage across two ends of the winding of the transformer is greater than the threshold voltage, the auxiliary switch is turned on so that the drive voltage is low-level to turn off the main switch and disable the damping unit.

3. The active damping circuit of dead time oscillation in claim 1, wherein the voltage determining unit is a Zener diode, and the threshold voltage is a breakdown voltage of the Zener diode.

4. The active damping circuit of dead time oscillation in claim 1, wherein the auxiliary switch is a BJT.

5. The active damping circuit of dead time oscillation in claim 1, wherein the voltage biased unit is a voltage-dividing resistor network.

6. The active damping circuit of dead time oscillation in claim 1, wherein the main switch is a MOSFET.

7. The active damping circuit of dead time oscillation in claim 1, wherein the damping unit is a resistor-capacitor network.

8. The active damping circuit of dead time oscillation in claim 1, further comprising:
   a diode coupled between the winding of the transformer and the damping unit.

9. The active damping circuit of dead time oscillation in claim 1, wherein the active damping circuit of dead time oscillation is applied to a flyback converter, a forward converter, a push-pull converter, a half-bridge converter, or a full-bridge converter.

* * * * *